United States Patent
Pilla et al.

(10) Patent No.: US 10,256,294 B2
(45) Date of Patent: Apr. 9, 2019

(54) VERTICAL GALLIUM NITRIDE POWER FIELD-EFFECT TRANSISTOR WITH A FIELD PLATE STRUCTURE

(71) Applicant: RF Micro Devices, Inc., Greensboro, NC (US)

(72) Inventors: Subrahmanyam V. Pilla, Plano, TX (US); Tso-Min Chou, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/053,715

(22) Filed: Feb. 25, 2016

(65) Prior Publication Data

US 2016/0343801 A1 Nov. 24, 2016

Related U.S. Application Data

(60) Provisional application No. 62/162,869, filed on May 18, 2015.

(51) Int. Cl.

| | |
|---|---|
| H01L 29/06 | (2006.01) |
| H01L 29/08 | (2006.01) |
| H01L 29/20 | (2006.01) |
| H01L 29/40 | (2006.01) |
| H01L 29/78 | (2006.01) |
| H01L 29/66 | (2006.01) |
| H01L 29/205 | (2006.01) |
| H01L 29/417 | (2006.01) |

(52) U.S. Cl.
CPC ........ *H01L 29/063* (2013.01); *H01L 29/0878* (2013.01); *H01L 29/0886* (2013.01); *H01L 29/2003* (2013.01); *H01L 29/205* (2013.01); *H01L 29/66522* (2013.01); *H01L 29/7802* (2013.01); *H01L 29/7828* (2013.01); *H01L 29/407* (2013.01); *H01L 29/41766* (2013.01)

(58) Field of Classification Search
None
See application file for complete search history.

(56) References Cited

U.S. PATENT DOCUMENTS

| | | |
|---|---|---|
| 8,835,998 B2 | 9/2014 | Simon et al. |
| 8,866,148 B2 | 10/2014 | Disney |
| | (Continued) | |

OTHER PUBLICATIONS

Ambacher, O., "Polarization Induced Effects in AlGaN/GaN Heterostructures," ACTA Physica Polonica Series A General Physics, vol. 98, No. 3, 2000, pp. 195-201.

(Continued)

*Primary Examiner* — Reema Patel
*Assistant Examiner* — Steven M Christopher
(74) *Attorney, Agent, or Firm* — Withrow & Terranova, P.L.L.C.

(57) ABSTRACT

The present disclosure relates to a vertical gallium-nitride (GaN) power field-effect transistor (FET) with a field plate structure. The vertical GaN power FET includes a conductive substrate, a drift region, a field plate structure, a channel region with tapered side walls, a gate dielectric region, a gate contact, a drain contact and source contacts. The field plate structure includes a lower layer formed of pi p-type graded AlGaN and a upper layer formed of p-type GaN. The field plate structure utilizes the charge separation at the interface between the lower layer and the upper layer to achieve high breakdown voltage.

20 Claims, 2 Drawing Sheets

(56) References Cited

U.S. PATENT DOCUMENTS

| | | | |
|---|---|---|---|
| 2013/0153967 A1* | 6/2013 | Curatola | H01L 29/407 257/194 |
| 2013/0240896 A1* | 9/2013 | Ozaki | H01L 29/7786 257/76 |
| 2014/0175515 A1* | 6/2014 | Then | H01L 29/772 257/194 |
| 2014/0264369 A1* | 9/2014 | Padmanabhan | H01L 29/7787 257/76 |
| 2015/0060876 A1 | 3/2015 | Xing et al. | |
| 2016/0064555 A1* | 3/2016 | Chu | H01L 29/7827 257/76 |

OTHER PUBLICATIONS

Oka, Tohru et al., "Vertical GaN-based trench metal oxide semiconductor field-effect transistors on a free-standing GaN substrate with blocking voltage of 1.6 kV," Applied Physics Express, vol. 7, No. 2, Jan. 28, 2014, 3 pages.

* cited by examiner

VERTICAL GALLIUM NITRIDE POWER FIELD-EFFECT TRANSISTOR WITH A FIELD PLATE STRUCTURE

RELATED APPLICATIONS

This application claims the benefit of U.S. provisional patent application No. 62/162,869, filed May 18, 2015, the disclosure of which is incorporated herein by reference in its entirety.

FIELD OF THE DISCLOSURE

The present disclosure relates to a gallium-nitride (GaN) power field-effect transistor (FET), and more particularly to a vertical GaN power FET with a field plate structure.

BACKGROUND

Power semiconductor devices are critical for energy infrastructure, which provides power generation and distribution to end user applications such as elevators, electric trains, ship propulsion, automobiles, electric motors, home appliances, computers, and powering hand held devices. At the heart of all of these power systems is a power converter to step-up or step-down electric voltages. A core component of the power converter is a power switch. An ideal power switch must pass any amount of current with the least or no voltage drop in a closed or ON state and withstand all applied voltage with no current flowing in an open or OFF state. For a real power switch, low ON state resistance, high breakdown voltage, high switching speed, and the ability to sustain high temperature of operation are critical figures of merit (FOM). Gallium nitride (GaN) is a wide bandgap semiconductor material often used to form a power switch due to its high electron mobility, high critical field, and the ability to sustain high temperatures of operation when compared to other widely used semiconductors such as Silicon (Si) or Silicon Carbon (SiC).

A power switch may be implemented by a power field-effect transistor (FET). A power FET formed by gallium nitride is classified as either lateral or vertical based on the direction of majority carriers (electrons) that flow in the FET structure. In the lateral power FET, the electrons flow along the surface of a two dimensional electron gas (2DEG) layer realized at the heterojunction of GaN and its alloys with Aluminum (Al) or Indium (In). To reduce material cost, in some of the lateral GaN power FETs, the GaN and GaN alloys are grown on widely available, low cost Si substrates. However, this approach has several known disadvantages including the need for large lateral dimensions in proportion to voltage and current rating, degraded thermal handling capability due to the use of the Si substrates, and significant current collapse where trapped charges near the interface between a gate metal and an underlying semiconductor region reduce the available current at high switching speeds due to the slow response of the trapped charges.

The vertical GaN power FET, on the other hand, is fabricated on a bulk GaN substrate where the electrons flow vertically through the bulk GaN substrate. As most of the voltage drop takes place in the vertical direction, the lateral dimensions of the vertical GaN power FET need not scale with voltage unlike lateral devices. Switching speed and thermal handling capabilities are enhanced while the current collapse problem is mostly eliminated. However, p-n junctions are required in the vertical GaN power FET to achieve higher switching speeds, which has been a significant challenge to realize. The activation energy $E_A$ of the most commonly used p-type dopant, such as Magnesium(Mg), in GaN is about 200 meV, which is several times the thermal energy $k_BT$ at room temperature (where $k_B$ is the Boltzmann constant, and T is temperature). Therefore, even to achieve moderate hole concentration, like $1 \times 10^{16}$ /cm$^3$, at room temperature, the p-type dopant concentration must be 5 to 10 times higher compared to the n-type dopant concentration needed to achieve the same electron concentration. The high concentrate of the p-type dopant leads to low carrier mobility arising from impurity scattering. This problem is well addressed by polarization doping of graded aluminum gallium nitride (AlGaN)—a percentage of aluminum in the graded AlGaN varies gradually from a bottom to a top of a region- with p-type dopant. Consequently, built-in electric fields allow holes to be field-ionized from deep p-type-acceptor dopant atoms. This polarization enhancement to hole generation is shown to be two times to six times higher compared to a conventional doping process at room temperature. With the same concentration of the p-type dopant, the graded AlGaN improves carrier mobility compared to normal GaN material. A primary challenge in utilizing polarization induced (pi) p-type graded AlGaN (pi p-AlGaN) in real devices is to manage the excessive mechanical stress built in a pi p-AlGaN region grown on a bulk graded AlGaN substrate. In conventional designs of a vertical GaN FET, both the pi p-AlGaN region (>400 nms) and the underlying graded AlGaN substrate (5 to 10 μm) must be sufficiently thick for achieving high break down voltage(>1 kV). These graded AlGaN regions, with a total thickness >5 um, result in cracked surfaces that render the wafers unsuitable for device fabrication.

FIG. 1 provides an example of a conventional vertical GaN power FET 10. The vertical GaN power FET 10 includes a conductive substrate 12, a drift region 14, a pi p-AlGaN region 16, and a channel region 18. The drift region 14 resides over a top surface of the conductive substrate 12; the pi p-AlGaN region 16 resides over the drift region 14; and the channel region 18 extends vertically through the pi p-AlGaN region 16 into the drift region 14. The vertical GaN power FET 10 also includes ohmic contact regions 20 and source contact regions 22 within the pi p-AlGaN region 16, a conducting layer 24 over the channel region 18 extending to connect the source contact regions 22; and a gate dielectric region 26 over the conducting layer 24. In addition, a gate metal contact 28 resides over the gate dielectric region 26; source metal contacts 30 reside over the pi p-AlGaN region 16; and a drain metal contact 32 resides over the conductive substrate 12. In detail, the conductive substrate 12 is formed of GaN and doped with an n-type dopant. The drift region 14 is formed of graded AlGaN, wherein a percentage of aluminum in the graded AlGaN increases from a bottom to a top of the drift region 14. The drift region 14 is doped with about a $1 \times 10^{16}$/cm$^3$ concentration of an n-type dopant and has a thickness between 5 μms to 10 μms. Those with ordinary skill in the art will recognize that the volume charge spreading achieved in the graded AlGaN drift region 14 is critical to achieve superior breakdown performance (breakdown voltage>1000V) of the vertical GaN power FET 10. The pi p-AlGaN region 16 is formed of graded AlGaN, wherein a percentage of aluminum in the graded AlGaN increases from a top to a bottom of the pi p-AlGaN region 16. The pi p-AlGaN region 16 is thicker than 400 nms and polarization doped with at least a $1 \times 10^{18}$/cm$^3$ concentration p-type dopant. The graded concentration of aluminum improves the carrier mobility. However, because of the mechanical constraint, it is a challenge to achieve a distinct aluminum concentration variation (normally from 0% to 30%) within a thick region, like the drift region 14 and the pi p-AlGaN region 16, without cracking surfaces.

Accordingly, there remains a need for improved power FET designs to achieve high switching speed and superior breakdown performance with a low possibility of cracked surfaces that render the wafers unsuitable for device fabrication.

SUMMARY

The present disclosure relates to a vertical gallium-nitride (GaN) power field-effect transistor (FET) with a field plate structure. The vertical GaN power FET includes a conductive substrate, a drift region residing over a top surface of the conductive substrate and having a recess, a field plate structure residing over the drift region, a channel region extending vertically through the field plate structure and into the recess of the drift region, a gate dielectric region over the channel region, a gate contact over the gate dielectric region, a drain contact over a bottom surface of the conductive substrate, and source contacts over the field plate structure. The field plate structure includes a lower layer formed of graded aluminum gallium nitride (AlGaN) over the drift region, and an upper layer formed of GaN with essentially no aluminum content over the lower layer. Within the lower layer, a percentage of aluminum in the graded AlGaN decreases from no more than 33% to 0% from a bottom to a top of the lower layer. A thickness of the lower layer is no more than 125 nms and a thickness of the upper layer is at least 50 nms. The channel region has tapered side walls such that a width of the channel region decreases from an upper portion to a lower portion of the channel region. An angle formed between the tapered side walls and a vertical plane that is orthogonal to a plane in which the conductive substrate resides is between 15 degrees and 45 degrees.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
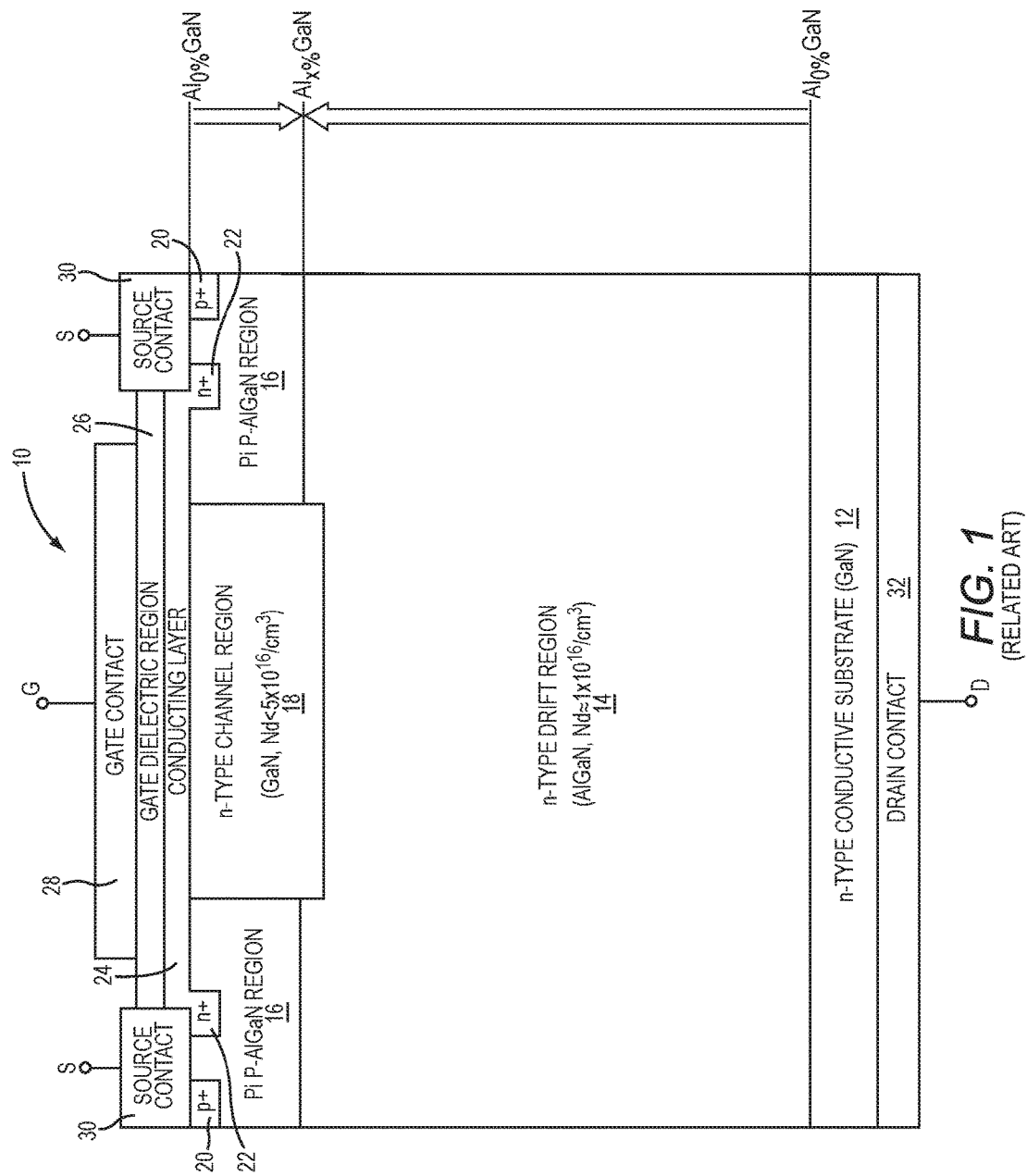
FIG. 1 shows a conventional vertical gallium nitride power FET with a thick region formed of pi p-type graded AlGaN.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
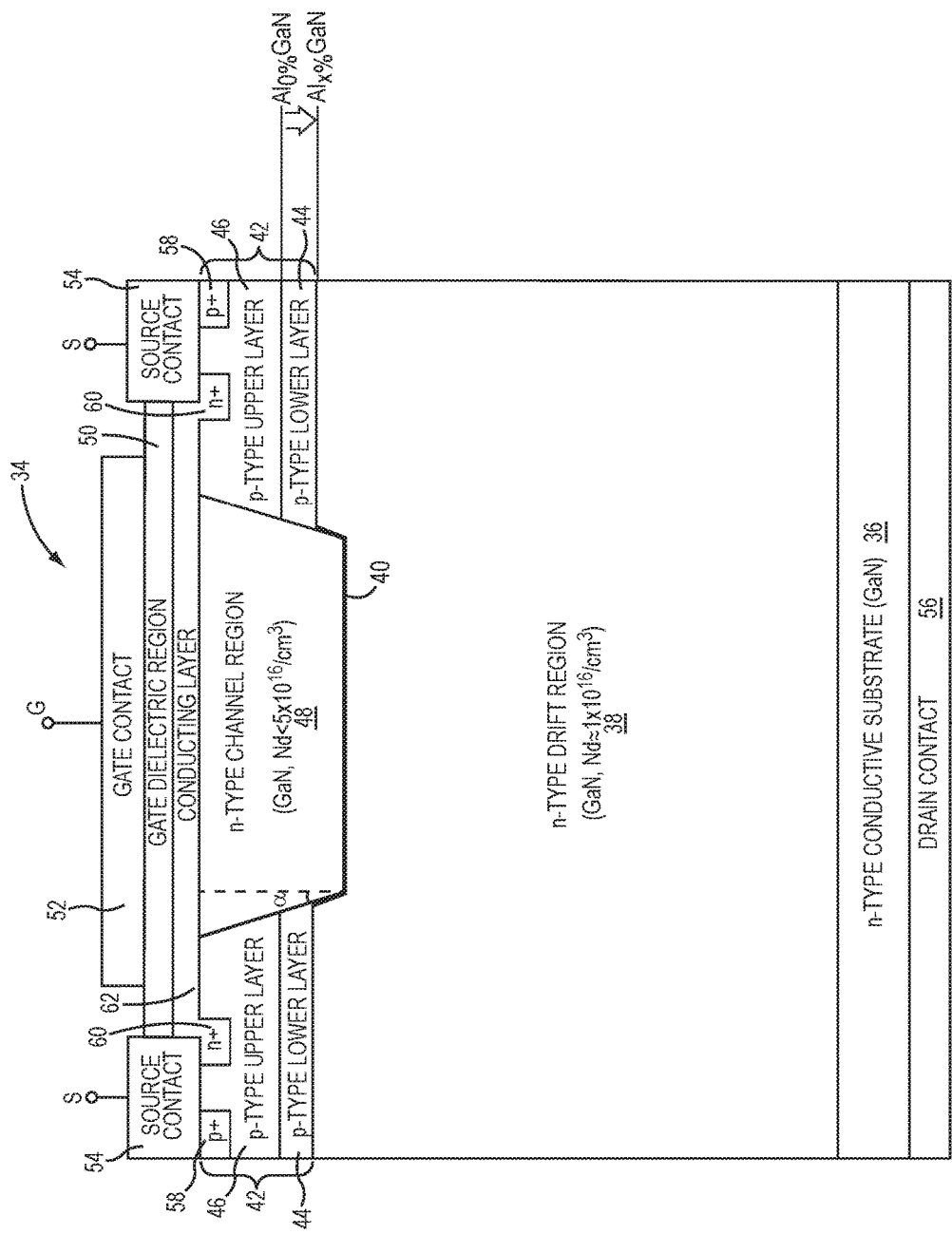
FIG. 2 shows an exemplary vertical gallium nitride power FET with a field plate structure, which includes a thin layer formed of pi p-type graded AlGaN and a thin layer formed of p-type GaN.

FIG. 2 provides a vertical GaN power FET design according to one embodiment of the present disclosure. In this embodiment, a vertical GaN power FET 34 includes a conductive substrate 36, a drift region 38 residing over a top surface of the conductive substrate 36 and having a recess 40, and a field plate structure 42 residing over the drift region 38. The field plate structure 42 includes a lower layer 44 and an upper layer 46. The vertical GaN power FET 34 further includes a channel region 48 extending vertically through the field plate structure 42 and into the recess 40 of the drift region 38. In addition, a gate dielectric region 50 resides over the channel region 48, a gate contact 52 resides over the gate dielectric region 50, source contacts 54 reside over the upper layer 46 of the field plate structure 42, and a drain contact 56 resides over a bottom surface of the conductive substrate 36.

In detail, the conductive substrate 36 is formed of GaN (both Ga polar GaN and N polar GaN are applicable) and doped with an n-type dopant. The drift region 38 may be formed of GaN with essentially no aluminum content or formed of graded AlGaN, where a percentage of aluminum in the graded AlGaN of the drift region 38 increases from 0% to no more than 5% from a bottom to a top of the drift region 38 (not shown). The drift region 38 is doped with the n-type dopant. A density of the n-type dopant within the drift region 38 is substantially equal to $1\times10^{16}/cm^3$ and a thickness of the drift region 38 is between 5 μm and 9 μm. The recess 40 is located at the center top portion of the drift region 38 and has a depth between 10 nms and 200 nms measured from a bottom surface of the lower layer 44.

For the field plate structure 42, the lower layer 44 resides over the drift region 38 and the upper layer 46 resides over the lower layer 44. The lower layer 44 has a thickness of no more than 125 nms, and the upper layer 46 has a thickness between 50 nms and 300 nms, between 175 nms and 225 nms, or between 190 nms and 210 nms. The lower layer 44 is formed of graded AlGaN and doped with a p-type dopant (such as Magnesium), where a percentage of aluminum in the graded AlGaN of the lower layer 44 decreases from no more than 33% to 0% from a bottom to a top of the lower layer 44. In different applications, the percentage of aluminum in the graded AlGaN of the lower layer 44 may decrease from no more than 20% to 0% or no more than 10% to 0% from the bottom to the top of the lower layer 44. Further, the lower layer 44 may also be formed of graded indium gallium nitride (InGaN) and doped with the p-type dopant. A percentage of indium in the InGaN of the lower layer may decrease from no more than 33% to 0% from a bottom to a top of the lower layer 44. The upper layer 46 is formed by GaN with essentially no aluminum content and doped with the p-type dopant. A density of the p-type dopant within the lower layer 44 is greater than a density of the p-type dopant within the upper layer 46. Typically, the density of the p-type dopant within the lower layer 44 is more than $1\times10^{18}/cm^3$ (about $3\times10^{18}/cm^3$ is desired), while the density of the p-type dopant within the upper layer 46 is no more than $1\times10^{18}/cm^3$ (about $5\times10^{17}/cm^3$ is desired). In order to achieve a high density (more than $1\times10^{18}/cm^3$) of the p-type dopant within the lower layer 44, a polarization doping process may be applied.

Compared to the conventional vertical GaN power FET 10, the vertical GaN power FET 34 with the field plate structure 42 does not include the thick pi p-type graded AlGaN region. The built-in mechanical stress in the field plate structure 42 is reduced due to the thinness of the lower layer 44 formed of pi p-type graded AlGaN and the thinness of the upper layer 46 formed of p-type GaN, and thereby the reliability of the vertical GaN power FET 34 increases. In addition, because of the sharp density change of the p-type dopant between the lower layer 44 and the upper layer 46, sufficient charge separation—a two dimensional hole gas (2DHG)—is realized at the heterojunction of the lower layer 44 and the upper layer 46 within the field plate structure 42 (not shown in FIG. 2). Those of ordinary skill in the art will recognize that the charge separation provided by the field plate structure 42 is adequate to achieve superior breakdown performance (breakdown voltage>1000V) and there is no need for a thick graded AlGaN drift region with a distinct aluminum concentration variation (normally from 0% to 30%) to achieve volume charge spreading to get high breakdown voltage. Consequently, the built-in mechanical stresses in the drift region 38 are significantly reduced and the reliability of the vertical GaN power FET 34 is enhanced. Furthermore, a two dimensional electron gas (2DEG) region realized at the heterojunction of the lower layer 44 with the underlying drift region 38 (not shown in FIG. 2) helps in spreading the negative charges in the drift region 38 while lowering the ON resistance of the vertical GaN power FET 34.

A significant portion of the field plate structure 42 is converted to the channel region 48 by an etching and regrowth process. The channel region 48 extends vertically through the field plate structure 42 and into the recess 40 of the drift region 38. The interface between the drift region 38 and the channel region 48 where regrowth interface lies is substantially separated from the interface between the drift region 38 and the lower layer 44 where high electrical fields are expected. This results in lower leakage arising from any regrowth interface defects. The channel region 48 is formed of GaN and doped with the n-type dopant. A density of the n-type dopant within the channel region 48 is no more than $5\times10^{16}/cm^3$ (close to the density of the n-type dopant of the drift region 38). In order to align the crystal surfaces of the GaN material, the side walls of the channel region 48 may be tapered to create a polar or semi-polar interface between the channel region 48 and the field plate structure 42. The width of the channel region 48 decreases from an upper portion of the channel region 48 to a lower portion of the channel region 48. An angle a formed between the sidewalls and a vertical plane that is orthogonal to a plane in which the conductive substrate 36 resides is between 15 degrees and 45 degrees, in a first embodiment, and between 23 degrees and 28 degrees, in a second embodiment.

Ohmic contact regions 58 and source contact regions 60 are located within the upper layer 46 and in contact with the source contacts 54, which are akin to the conventional Silicon MOSFET design. The ohmic contact regions 58 and source contact regions 60 may be realized by shallow ion implantation or by regrowth and have a thickness between 20 nms and 30 nms. As GaN does not have a native oxide similar to Si, the gate dielectric region 50 deposited below the gate contact 52 may be formed of any non-electrically conductive oxides, nitrides, or fluorides such as $SiN_x$, $SiO_2$, and $Al_2O_3$. A thin (between 5 nms and 10 nms) conducting layer 62 formed of AlGaN is placed in between the gate dielectric region 50 and the channel region 48. The gate contact 52, the gate dielectric region 50, the conducting layer 62 and the channel region 48 form the well-known Metal-Oxide-Semiconductor-Heterostructure (MOSH) structure. Additionally, the thin conducting layer 62, which conducts majority carriers, will electrically connect the source contact regions 60 which are in electrical contact with the source contacts 54.

Those skilled in the art will recognize improvements and modifications to the embodiments of the present disclosure. All such improvements and modifications are considered within the scope of the concepts disclosed herein and the claims that follow.

What is claimed is:

1. A gallium-nitride (GaN) power field-effect transistor (FET) comprising:
   a conductive substrate;
   a drift region residing over a top surface of the conductive substrate and having a recess;
   a field plate structure residing over the drift region and comprising a lower layer formed of graded aluminum gallium nitride (AlGaN) over the drift region, and an upper layer formed of non-graded GaN and essentially free of aluminum content over the lower layer, wherein:
      the lower layer and the upper layer are doped with a same polarity of dopants;
      the lower layer and the upper layer have different dopant densities; and
      a percentage of aluminum in the graded AlGaN of the lower layer decreases from no more than 33% to 0% from a bottom to a top of the lower layer;
   a channel region extending vertically through the field plate structure and into the recess, wherein the channel region is formed of GaN and directly surrounded by the upper layer and the lower layer of the field plate structure;
   a gate dielectric region over the channel region;
   a gate contact over the gate dielectric region;
   source contacts over the upper layer of the field plate structure;
   a drain contact over a bottom surface of the conductive substrate; and
   ohmic contact regions and source contact regions within the upper layer of the field plate structure, wherein the source contact regions and the upper layer of the field plate structure are doped with different polarities of dopants.

2. The GaN power FET of claim 1 further comprising a conducting layer between the gate dielectric region and the channel region, wherein the conducting layer is formed of AlGaN.

3. The GaN power FET of claim 2 wherein a thickness of the conducting layer is between 5 nms and 10 nms.

4. The GaN power FET of claim 1 wherein the drift region is formed of GaN and essentially free of aluminum content.

5. The GaN power FET of claim 4 wherein a thickness of the drift region is between 5 μms and 9 μms.

6. The GaN power FET of claim 1 wherein the drift region is formed of graded AlGaN, where a percentage of aluminum in the graded AlGaN of the drift region decreases from no more than 5% to 0% from a top to a bottom of the drift region.

7. The GaN power FET of claim 1 wherein the recess of the drift region has a depth between 10 nms and 200 nms.

8. The GaN power FET of claim 1 wherein a thickness of the upper layer of the field plate structure is between 50 nms and 300 nms.

9. The GaN power FET of claim 1 wherein a thickness of the upper layer of the field plate structure is between 175 nms and 225 nms.

10. The GaN power FET of claim 1 wherein a thickness of the lower layer of the field plate structure is no more than 125 nms.

11. The GaN power FET of claim 1 wherein the percentage of the aluminum in the graded AlGaN of the lower layer decreases from no more than 20% to 0% from the bottom to the top of the lower layer.

12. The GaN power FET of claim 1 wherein the channel region has tapered side walls such that a width of the channel region decreases from an upper portion to a lower portion of the channel region.

13. The GaN power FET of claim 12 wherein an angle formed between the tapered side walls and a vertical plane that is orthogonal to a plane in which the conductive substrate resides is between 15 degrees and 45 degrees.

14. The GaN power FET of claim 12 wherein an angle formed between the tapered side walls and a vertical plane that is orthogonal to a plane in which the conductive substrate resides is between 23 degrees and 28 degrees.

15. The GaN power FET of claim 1 wherein the conductive substrate, the drift region, and the channel region are doped with an n-type dopant, and the upper layer and the lower layer of the field plate structure are doped with a p-type dopant.

16. The GaN power FET of claim 15 wherein a density of the p-type dopant within the lower layer is greater than a density of the p-type dopant within the upper layer.

17. The GaN power FET of claim 16 wherein the density of the p-type dopant within the lower layer is more than $1 \times 10^{18}/cm^3$.

18. The GaN power FET of claim 16 wherein the density of the p-type dopant within the upper layer is no more than $1 \times 10^{18}/cm^3$.

19. The GaN power FET of claim 15 wherein a density of the n-type dopant within the channel region is no more than $5 \times 10^{16}/cm^3$.

20. A gallium-nitride (GaN) power field-effect transistor (FET) comprising:
   a conductive substrate;
   a drift region residing over a top surface of the conductive substrate and having a recess;
   a field plate structure residing over the drift region and comprising a lower layer formed of graded indium gallium nitride (InGaN) over the drift region, and an upper layer formed of non-graded GaN and essentially free of indium content over the lower layer, wherein:
      the lower layer and the upper layer are doped with a same polarity of dopants;
      the lower layer and the upper layer have different dopant densities; and
      a percentage of indium in the InGaN of the lower layer decreases from no more than 33% to 0% from a bottom to a top of the lower layer;
   a channel region extending vertically through the field plate structure and into the recess, wherein the channel region is formed of GaN and directly surrounded by the upper layer and the lower layer of the field plate structure;
   a gate dielectric region over the channel region;
   a gate contact over the gate dielectric region;
   source contacts over the upper layer of the field plate structure;
   a drain contact over a bottom surface of the conductive substrate; and ohmic contact regions and source contact regions within the upper layer of the field plate structure, wherein the source contact regions and the upper layer of the field plate structure are doped with different polarities of dopants.

* * * * *

UNITED STATES PATENT AND TRADEMARK OFFICE
CERTIFICATE OF CORRECTION

PATENT NO. : 10,256,294 B2
APPLICATION NO. : 15/053715
DATED : April 9, 2019
INVENTOR(S) : Subrahmanyam V. Pilla and Tso-Min Chou It is certified that error appears in the above-identified patent and that said Letters Patent is hereby corrected as shown below:

In the Specification

In Column 6, Line 38, replace "angle a" with --angle $\alpha$--.

Signed and Sealed this
Fourteenth Day of May, 2019

Andrei Iancu
*Director of the United States Patent and Trademark Office*